United States Patent
Huang

(10) Patent No.: US 8,338,205 B2
(45) Date of Patent: Dec. 25, 2012

(54) METHOD OF FABRICATING AND ENCAPSULATING MEMS DEVICES

(75) Inventor: Herb He Huang, Shanghai (CN)

(73) Assignee: Shanghai Lexvu Opto Microelectronics Technology Co., Ltd., Shanghai (CN)

( * ) Notice: Subject to any disclaimer, the term of this patent is extended or adjusted under 35 U.S.C. 154(b) by 56 days.

(21) Appl. No.: 12/873,172

(22) Filed: Aug. 31, 2010

(65) Prior Publication Data

US 2011/0053321 A1 Mar. 3, 2011

Related U.S. Application Data

(60) Provisional application No. 61/238,440, filed on Aug. 31, 2009.

(51) Int. Cl.
*B81C 1/00* (2006.01)
*H01L 23/29* (2006.01)

(52) U.S. Cl. .............. 438/48; 438/51; 438/55; 438/127; 438/703; 438/749; 438/761

(58) Field of Classification Search .................. 438/106, 438/121, 124–127, 99, 706, 710, 725, 759, 438/761, 763, 780, 942, FOR. 135, FOR. 47; 257/E51.012, E51.027, E21.024, E21.033, 257/E21.032, E21.259, E21.492
See application file for complete search history.

(56) References Cited

U.S. PATENT DOCUMENTS

| | | | |
|---|---|---|---|
| 4,560,458 A | 12/1985 | Ueno et al. | |
| 5,326,427 A | 7/1994 | Jerbic | |
| 5,376,236 A | 12/1994 | Hanson et al. | |
| 5,399,237 A | 3/1995 | Keswick et al. | |
| 5,413,670 A | 5/1995 | Langan et al. | |
| 5,445,710 A | 8/1995 | Hori et al. | |
| 5,872,061 A | 2/1999 | Lee et al. | |
| 5,872,062 A | 2/1999 | Hsu | |
| 6,020,272 A | 2/2000 | Fleming | |
| 6,042,706 A * | 3/2000 | Fu | 204/298.12 |
| 6,046,659 A | 4/2000 | Loo et al. | |
| 6,117,786 A | 9/2000 | Khajehnouri et al. | |
| 6,197,610 B1 | 3/2001 | Toda | |
| 6,200,735 B1 | 3/2001 | Ikegami | |
| 6,342,449 B2 | 1/2002 | Miyakawa | |
| 6,531,404 B1 | 3/2003 | Nallan et al. | |
| 6,693,038 B1 | 2/2004 | Shen | |
| 6,720,256 B1 | 4/2004 | Wu et al. | |

(Continued)

FOREIGN PATENT DOCUMENTS

EP 2007/050416 * 5/2011

*Primary Examiner* — Olik Chaudhuri
*Assistant Examiner* — Quovaunda V Jefferson
(74) *Attorney, Agent, or Firm* — Knobbe, Martens, Olson & Bear, LLP

(57) ABSTRACT

A method of fabricating and encapsulating MEMS devices is disclosed, using least two carbon films as the dual sacrificial layers sandwiching a MEMS structural film which is anchored onto a substrate and covered by an encapsulating film containing a plurality of thru-film sacrificial release holes. The dual sacrificial carbon films are selectively removed via plasma-enhanced oxygen or nitrogen ashing through the thru-film sacrificial release holes for releasing the MEMS structural film inside a cavity formed between the encapsulating film and the substrate. The thru-film sacrificial release holes, preferably with a relative high asperity ratio, are then sealed off by depositing a hole-sealing film in a physical vapor deposition process or a chemical vapor deposition process or combination.

16 Claims, 4 Drawing Sheets

U.S. PATENT DOCUMENTS

| | | |
|---|---|---|
| 6,827,869 B2 | 12/2004 | Podlesnik et al. |
| 7,078,301 B2 | 7/2006 | Bojarczuk, Jr. et al. |
| 7,078,337 B2 | 7/2006 | Campbell et al. |
| 7,159,047 B2 | 1/2007 | Kleecka et al. |
| 7,265,429 B2 | 9/2007 | Wan |
| 7,310,175 B2 | 12/2007 | Monroe et al. |
| 7,323,401 B2 | 1/2008 | Ramaswamy et al. |
| 7,381,583 B1* | 6/2008 | Ebel et al. .............. 438/53 |
| 7,393,758 B2 | 7/2008 | Sridhar et al. |
| 2002/0001963 A1 | 1/2002 | Tadokoro et al. |
| 2003/0024902 A1 | 2/2003 | Li et al. |
| 2004/0125432 A1 | 7/2004 | Ishizuya et al. |
| 2005/0280152 A1 | 12/2005 | Fitzsimmons et al. |
| 2006/0264060 A1* | 11/2006 | Ramaswamy et al. ........ 438/758 |
| 2007/0032095 A1 | 2/2007 | Ramaswamy et al. |
| 2007/0045781 A1* | 3/2007 | Carlson et al. ............. 257/632 |
| 2009/0108381 A1* | 4/2009 | Buchwalter et al. ......... 257/415 |
| 2010/0015744 A1 | 1/2010 | Kazinzci |
| 2010/0308423 A1* | 12/2010 | Shimooka ................... 257/415 |

\* cited by examiner

METHOD OF FABRICATING AND ENCAPSULATING MEMS DEVICES

CROSS-REFERENCE TO RELATED APPLICATIONS

This application claims priority of U.S. provisional application No. 61/238,440, filed on Aug. 31, 2009, entitled "Method of fabricating and encapsulating MEMS devices", which is incorporated herein by reference in its entirety.

FIELD OF THE TECHNOLOGY

The present invention generally relates to a method for processing a suspended structural element in a microelectromechanical system (MEMS) device, and more specifically to a method of fabricating and encapsulating the suspended structural element in a MEMS device in a cavity above a solid state substrate by using dual sacrificial carbon films.

BACKGROUND

MEMS includes integrated micro devices, such as mechanical, optical and thermal sensing components, formed on a substrate made of a single or composite layers of solid state materials. The MEMS is preferably fabricated by using the state-of-art wafer batch processing techniques to form those micro devices, sized from nanometers to millimeters, on a solid state substrate like a silicon wafer. Those MEMS devices are operating for sensing, controlling, and actuating various mechanical, optical or chemical functions on a micro scale, individually in single units or collaboratively in arrays for generating coordinated overall effects on a macro scale. Typical applications of such MEMS devices include, but not limited to, accelerometers, gyroscopes, pressure sensors, chemical and flow sensors, micro-optics devices, optical scanners, fluid flow control devices, chemical sensing and chemical delivery systems, and biological sensors among many others.

Furthermore, MEMS devices are preferably fabricated together in a unified process with supporting integrated circuit (IC) devices on the same semiconductor substrate as an integrated silicon device, namely as an integrated MEMS. Advantageously, such integrated MEMS in a single chip solution not only greatly reduce the size, weight and power consumption but also enhance the performance of an application system when compared with the conventional construction which separates MEMS and supporting IC as different micro devices.

Fabrication of MEMS devices employs many of the same processing steps as the fabrication of IC. In particular, the formation of an MEMS device involves depositing and patterning thin films on a substrate, such as a silicon wafer, to produce complex micro devices. Solid state thin film materials commonly used include but not limited to silicon dioxide, silicon nitride, polycrystalline silicon (poly), amorphous silicon, aluminum, copper, refractory metals and their oxide or nitride compounds.

However, to achieve certain mechanical, optical or thermal functions of MEMS devices, it is necessary to spatially decouple selected micro structural elements in MEMS devices to form a gap or cavity between the decoupled and the rest. Such decoupling of micro structural elements in MEMS devices enables certain desired mechanical, thermal, chemical or optical functions as required. For example, a number of MEMS motion sensors contain two or more micro structural elements which are spatially separated but could move relatively to each other.

In many MEMS devices, cavities and suspended structural elements under encapsulation, in vacuum or filled with selective gases, are necessities to be fabricated only through a wafer-level micro machining process. One of the most widely used approaches to form a gap or cavity and thus to suspend the structural elements in an MEMS device involves selective etching a solid sacrificial layer or element. This sacrificial layer is first formed before the structural element and then as the underline physical supporting base, enables deposition and patterning of the structural element. After depositing the sacrificial layer and forming the structural element, photolithographic masking, patterning and etching steps are employed to remove the sacrificial layer, completely or at least partially.

Eventually, no matter at which later stages during the whole fabrication process of such MEMS devices, the sacrificial layer is selectively removed, either completely or at least partially, to release the structural element. And finally, the structural element needs to be enclosed in a cavity or encapsulated, either in vacuum or filled with selective gases, in a typical MEMS packaging process.

Scheme of fabricating the structural element formation while removing the sacrificial layer as well as encapsulating the structural element are core to the thin film based MEMS fabrication. It is extremely desirable that such schemes are substantially compatible to typical CMOS wafer fabrication processes, using the available thin film materials and their deposition and patterning process methods on standard CMOS thin film equipment and process line. This is where the prior art to date fails to address successfully.

SUMMARY

The present invention provides a method for fabricating and encapsulating a structural film in a cavity on a substrate, at least comprising:

depositing a first sacrificial carbon film onto the substrate;

photolithographically patterning the first sacrificial carbon film;

depositing a structural film;

photolithographically patterning the structural film and partially exposing the first sacrificial carbon film;

depositing a second sacrificial carbon film;

photolithographically patterning the second sacrificial carbon film;

depositing an encapsulating film covering the second sacrificial carbon film, the structural film and the first sacrificial carbon film;

photolithographically patterning the encapsulating film to form a plurality of thru-film sacrificial release holes;

selectively removing the first sacrificial carbon film and the second sacrificial carbon film by using a selective gaseous etch process in a reactor chamber so that the structural film is suspended in a cavity above the substrate; and depositing a hole-sealing film so that the thru-film sacrificial release holes are sealed.

In the disclosed method for fabricating and encapsulating an MEMS device on a substrate such as a single crystal silicon wafer, the process scheme and materials are fully compatible to typical CMOS fabrication process, eliminating the need for special process capability, process materials and even special packaging in MEMS that are substantially not compatible or even not allowable in CMOS fabrication.

BRIEF DESCRIPTION OF THE DRAWINGS

The disclosure may be more completely understood in consideration of the following detailed description of various embodiments in connection with the accompanying drawings, in which.

DETAILED DESCRIPTION

The drawings for illustration are not necessarily to scale, basically illustrating the framework and principles of the present invention. In the following description, reference is made to the accompanying drawings which form a part hereof, and which show, by way of illustration, the preferred embodiments of the present invention. It is understood that other embodiments may be utilized and structural changes may be made without departing from the scope of the present invention.

Figure 1A:
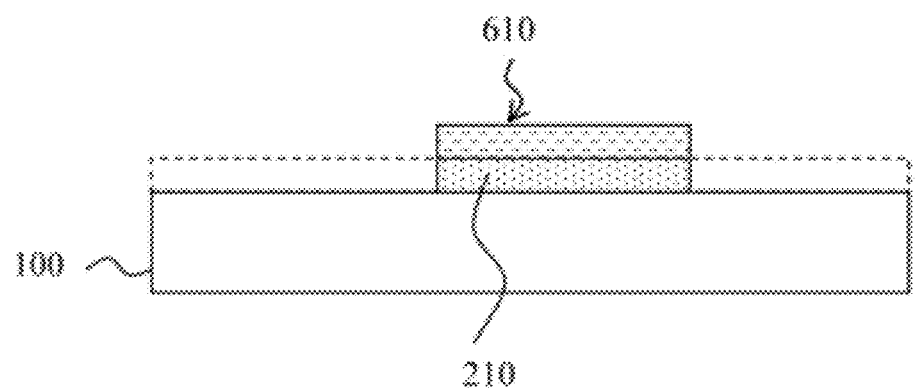
FIGS. 1a, 1b, 1c, 1d, 1e and 1f. illustrate the basic embodiment of the disclosed method for fabricating and encapsulating a structural element suspended on a substrate in sequential basic steps using a first sacrificial carbon film and a second sacrificial carbon film as the dual sacrificial layers in the cross section views.
Figure 1B:
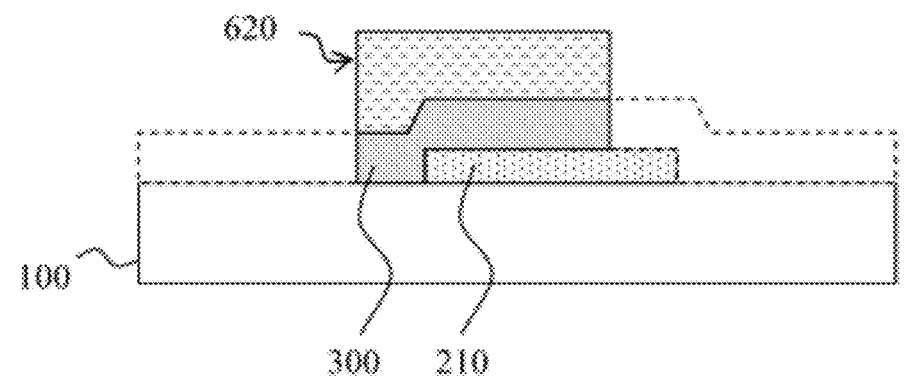

FIGS. 1a, 1b, 1c, 1d, 1e and if illustrate the basic embodiment of the disclosed method for fabricating and encapsulating a structural element 300 suspended on a substrate 100 in sequential basic steps using a first sacrificial carbon film 210 and a second sacrificial carbon film 220 as the dual sacrificial layers in the cross section views. As shown in FIG. 1a, a first sacrificial carbon film 210 is deposited by means of placing the substrate 100 in a reactor chamber; introducing a carbon-containing process gas into the chamber and introducing a layer-enhancing additive gas that enhances thermal properties of the carbon film; generating a reentrant toroidal RF plasma current in a reentrant path that includes a process zone overlying the substrate by coupling a plasma RF source power to an external portion of the reentrant path; and coupling RF plasma bias power or bias voltage to the substrate 100. The first sacrificial carbon film 210 may include less than 9 percent of hydrogen which is associated with the allowable impurity or dopants under consideration. Regarding the carbon film as the first/second sacrificial carbon film 210/220, the applicant explains that this application particularly focused on using thin film deposited carbon as the photo definable sacrificial material for multiple sacrificial layers; no other sacrificial should be specified. Furthermore, the applicant explains that in order to form carbon film, reactive or precursor gases containing carbon element must be induced to reaction chamber, additive such as layer-enhancing additive could preferably be induced so as to enhance the formation of carbon film layers to deposit.

By applying photoresist lithography, the first sacrificial carbon film 210 is partially protected by a lithographically defined first photoresist 610 as shown FIG. 1a. Using oxygen plasma ashing or nitrogen plasma ashing process, the first sacrificial carbon film 210 is patterned accordingly and then, the first photoresist 610 is selectively stripped from the first sacrificial carbon film 210 and the substrate 100, not by plasma ashing containing oxygen or nitrogen rather by other photoresist removal methods such as wet chemical photoresist stripping The structural film 300, which might include a single or multiple layers of solid state thin film materials, is then deposited conformal and adherent to the remaining portion of the first sacrificial carbon film 210 (FIG. 1b) and the exposed portion of the substrate 100. The structural film 300 is also photolithographically defined with a second photoresist 620 and selectively etched by a wet or dry etch process before removing the second photoresist 620 preferably by a wet stripping photoresist process.

Figure 1C:
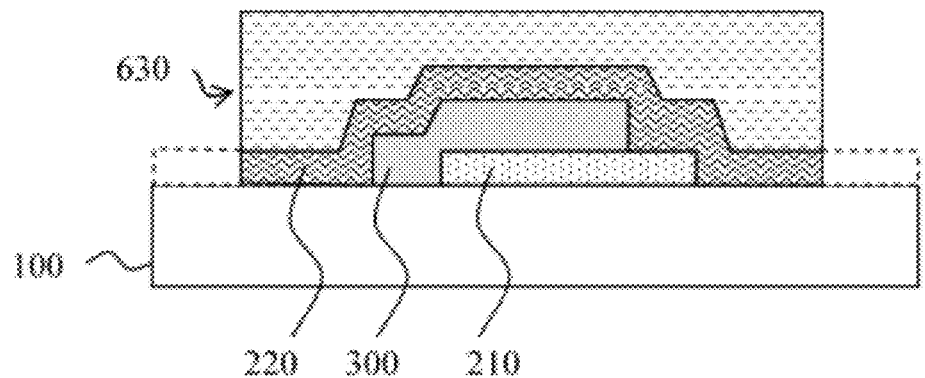

Unto the structural film 300, the exposed portions of the first sacrificial carbon film 210 and the substrate 100, a second sacrificial carbon film 220 is deposited through the same deposition process as for the first sacrificial carbon film 210 stated above. Similarly, the second sacrificial carbon film 220 may include less than 9 percent of hydrogen. The second sacrificial carbon film 220 is then patterned via a selective etching process per a photolithographically defining a third photoresist 630, the same as for patterning the first sacrificial carbon film 210 stated above (FIG. 1c).

Figure 1D:
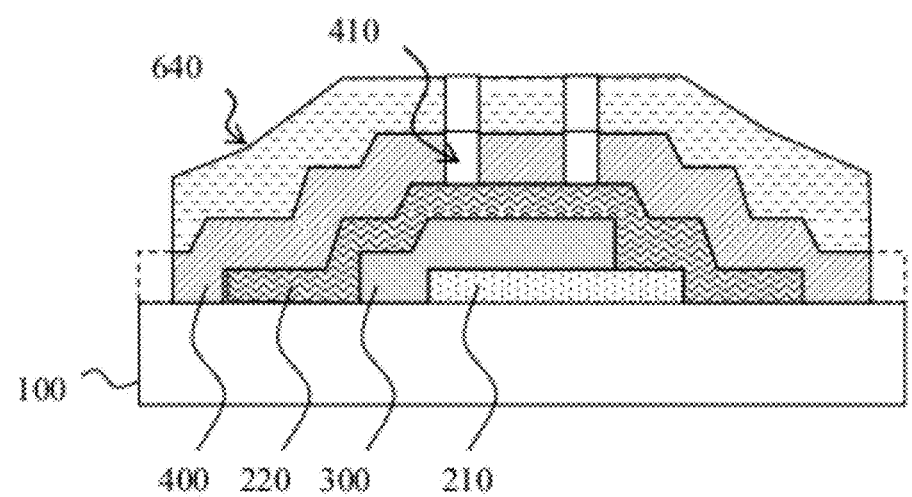
Figure 1E:
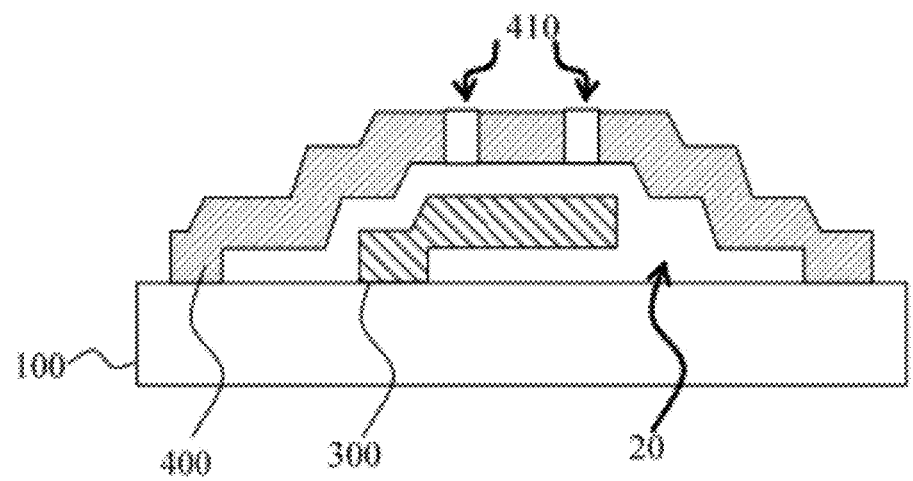

Completely covering the second sacrificial carbon film 220, the structural film 300, the exposed portions of the first sacrificial carbon film 210 and the substrate 100, an encapsulating film 400 is further deposited, which might include a single or multiple layers of solid state thin film materials. A forth photoresist 640 is applied and defined lithographically for selectively etching through the encapsulating film 400 to form a plurality of thru-film sacrificial release holes 410 (FIG. 1d).

The first critical part of the disclosed processing method is to completely remove both the first sacrificial carbon film 210 and the second sacrificial carbon film 220, partially covered by the encapsulating film 400 but exposed through the thru-film sacrificial release holes 410, by plasma ashing containing oxygen or nitrogen (FIG. 1e), such that a cavity 20 is formed within which the structural film 300 is mechanically anchored onto but partially suspended above the substrate 100. The plasma ashing may be implemented in such a selective gaseous etch process in a reactor chamber. The selective gaseous etch process may consist of oxygen or nitrogen in the reactor chamber containing plasma generated with a plasma source power. And in one of the extended embodiments, the photolithographically defined forth photoresist 640 is removed simultaneously with the first sacrificial carbon film 210 and the second sacrificial carbon film 220. In the plasma ashing process, the pressure is from atmosphere to $10^{-3}$ mtorr, oxygen or nitrogen volumetric concentration is proportional to pressure.

Eventually, a hole-sealing film 500 is deposited unto the encapsulating film 400 with all the thru-film sacrificial release holes 410 sealed or plugged (FIG. 10 but with only considerably minimum deposition induced into the cavity, either onto the structural film 300 or onto the substrate 100. Such hole-sealing deposition process is either physical vapor deposition (PVD), including an evaporation process and sputtering process, or chemical vapor deposition (CVD) or combination to completely seal off the thru-film sacrificial release holes 410. Generally the hole-sealing film comprises layers selected from polycrystalline silicon, amorphous silicon, single-crystal silicon, silicon dioxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide, elemental hafnium and hafnium alloys, hafnium oxide, elemental cobalt and cobalt alloys, elemental nickel and nickel alloys, elemental silver and silver alloys, elemental platinum and platinum alloys, elemental gold and gold alloys. However the applicant points out that the materials for the hole-sealing film 500 preferably include but not limit to silicon, silicon dioxide, silicon nitride, silicon carbide, silicon oxynitride, silicon carbon oxynitride, germanium, silicon germanium, carbon, aluminum, aluminum oxide, titanium, titanium nitride, tungstum, cobalt, nickel, copper, silver gold, platinum. The applicant points out that in order to have a better effect, the preferred temperature range for hole sealing is room (25° C.) to 1200° C., the pressure would be ambient down to 1.0 μTorr.

Figure 1F:
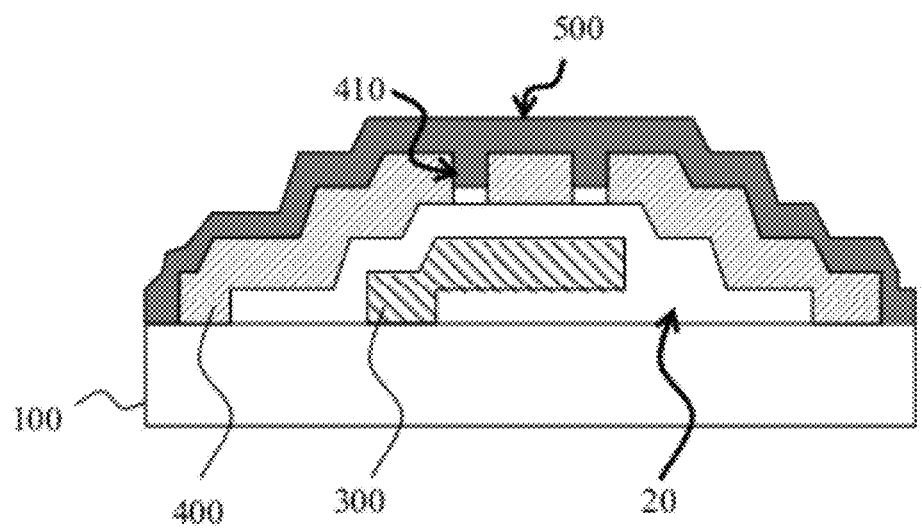
Figure 2:
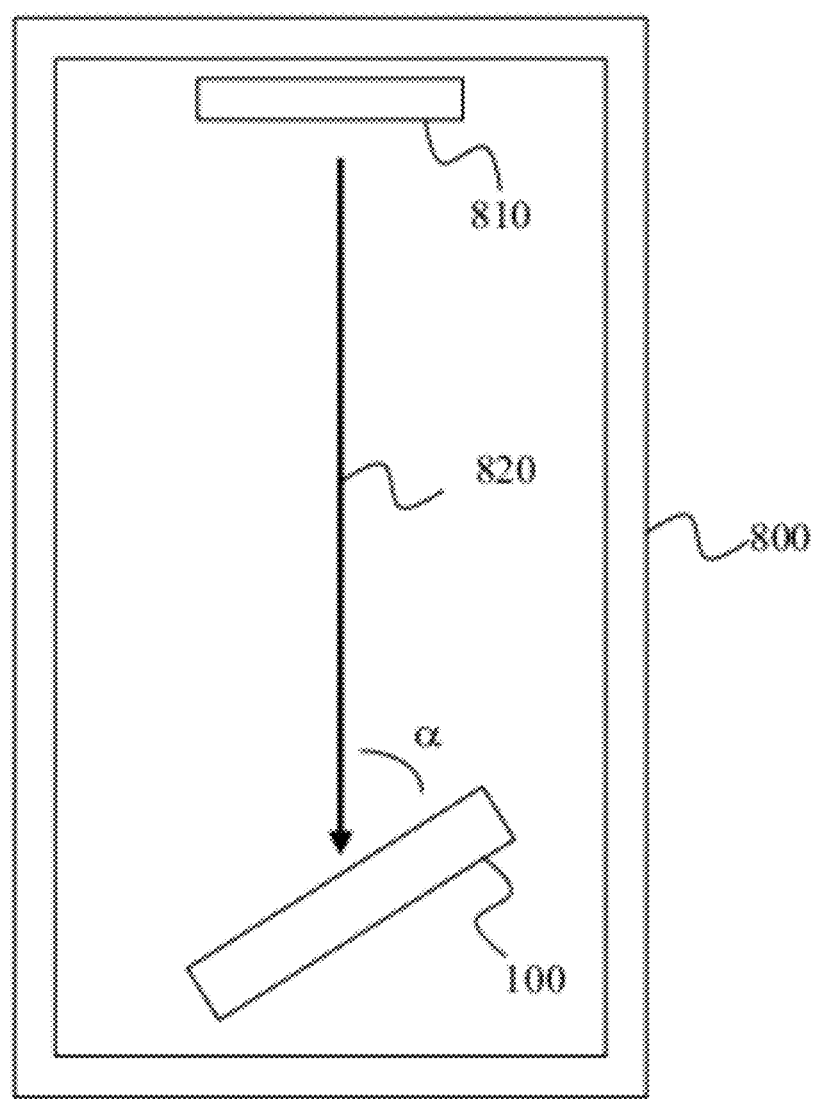
FIG. 2 illustrates one extended embodiment of the disclosed method for encapsulating a structural element suspended on a substrate in the cross section view.

FIG. 2 illustrates one extended embodiment of the disclosed method for encapsulating a structural element 300 suspended on a substrate 100 in the cross section views (FIG. 1*f*), and in particular, filling the thru-film sacrificial release holes 410. Hereby inside a deposition chamber 800, the substrate 100 is placed in a substantially slant angle alpha. relative to a target plate 810 which contains the deposition materials, so that the principal motion direction 820 of the sputtered species from the target plate 810 forms such the slant angle alpha. with the surface of the encapsulating film 400 and thus, not parallel to the thru-film sacrificial release holes 410, to improve the filling and to reduce undesired deposition into the cavity 20. Also the thru-film sacrificial release holes 410 are defined in the preferred configuration exhibiting a relative high asperity ratio, say larger than 1 to 1 for better sealing with minimum deposition into the cavity 20. The preferred coverage on the dimension of the release hole would be, height from 5 nm to 100 μm, diameter from 2 nm to 5 μm, aspect ratio (D:H) from 1:0.5 to 1:20. Furthermore, the applicant points out that the slant angle alpha is preferable in a range of 0 degree to 30 degree with sufficient coverage.

A number of solid state thin film materials are available to be used for forming the structural film 300 and the encapsulating film 400 as for providing desired mechanical, optical and/or chemical functions as well as for depositing the hole-sealing film 500. Those solid state thin film materials include but not limited to: polycrystalline silicon, amorphous silicon, single-crystal silicon, silicon dioxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide, elemental hafnium and hafnium alloys, hafnium oxide, elemental cobalt and cobalt alloys, elemental nickel and nickel alloys, elemental silver and silver alloys, elemental platinum and platinum alloys, elemental gold and gold alloys. Certain carbides are also potential candidates containing less than 60 percent of carbon, such as silicon carbide, tungsten carbide, aluminum carbide, and carbon nitride.

A process has been described as useful for fabricating and encapsulating the suspended thin film structural elements of MEMS device wafers. While specific applications and examples of the invention have been illustrated and discussed, the principles disclosed herein provide a basis for practicing the invention in a variety of ways and in a variety of IC and MEMS structures. Numerous variations are possible within the scope of the invention.

Finally, it should be understood that the above embodiments are only used to explain, but not to limit the technical solution of the present invention. In despite of the detailed description of the present invention with referring to the above preferred embodiments, it should be understood that various modifications, changes or equivalent replacements can be made by those skilled in the art without departing from the scope of the present invention and covered in the claims of the present invention.

What is claimed is:

1. A method for fabricating and encapsulating a suspended microstructure onto a substrate at least comprising:
   depositing a first sacrificial carbon film onto the substrate;
   partially protecting the first sacrificial carbon film by a photolithographically defined first photoresist;
   photolithographically patterning the first sacrificial carbon film by using oxygen plasma ashing or nitrogen plasma ashing process;
   selectively stripping the first photoresist by wet chemical photoresist stripping process;
   depositing a structural film;
   photolithographically patterning the structural film with a lithographically defined second photoresist and partially exposing the first sacrificial carbon film;
   depositing a second sacrificial carbon film;
   partially protecting the second sacrificial carbon film by a photolithographically defined third photoresist;
   photolithographically patterning the second sacrificial carbon film by using oxygen plasma ashing or nitrogen plasma ashing process;
   selectively stripping the third photoresist by wet chemical photoresist stripping process;
   depositing an encapsulating film covering the second sacrificial carbon film, the structural film and the first sacrificial carbon film;
   photolithographically patterning the encapsulating film to form a plurality of thru-film sacrificial release holes;
   selectively removing the first sacrificial carbon film and the second sacrificial carbon film by using a selective gaseous etch process in a reactor chamber so that the structural film is suspended in a cavity above the substrate; and
   depositing a hole-sealing film so that the thru-film sacrificial release holes are sealed;
   wherein the first sacrificial carbon film and the second sacrificial carbon film are deposited by:
   placing the substrate in a reactor chamber;
   introducing a carbon-containing process gas into the chamber and introducing a layer-enhancing additive gas that enhances thermal properties of the first sacrificial carbon film and the second sacrificial carbon film;
   generating a reentrant toroidal RF plasma current in a reentrant path that includes a process zone overlying the substrate by coupling a plasma RF source power to an external portion of the reentrant path; and
   coupling RF plasma bias power or bias voltage to the substrate.

2. The method according to claim 1 wherein the selective gaseous etch process uses oxygen in a reactor chamber containing plasma generated with a plasma source power.

3. The method according to claim 1 wherein the selective etch gaseous etch process uses nitrogen in the reactor chamber containing plasma generated with a plasma source power.

4. The method according to claim 1 wherein the first sacrificial carbon film and the second sacrificial carbon film comprise less than 9 percent of hydrogen.

5. The method according to claim 1 wherein the substrate comprises layers selected from among solid state semiconductor, dielectric and conductor materials.

6. The method according to claim 1 wherein the structural film comprises layers selected from the group consisting of polycrystalline silicon, amorphous silicon, single-crystal silicon, silicon oxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide, elemental hafnium and hafnium alloys, hafnium oxide, elemental cobalt and cobalt alloys, elemental nickel and nickel alloys, elemental silver and silver alloys, elemental platinum and platinum alloys, elemental gold and gold alloys.

7. The method according to claim 1 wherein the encapsulating film comprises layers selected from the group consisting of polycrystalline silicon, amorphous silicon, single-crystal silicon, silicon oxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide, elemental hafnium and hafnium alloys, hafnium oxide, elemental cobalt and cobalt alloys, elemental nickel and nickel alloys, elemental silver and silver alloys, elemental platinum and platinum alloys, elemental gold and gold alloys.

8. The method according to claim 1 wherein the hole-sealing film comprises layers selected from the group consisting of polycrystalline silicon, amorphous silicon, single-crystal silicon, silicon dioxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide, elemental hafnium and hafnium alloys, hafnium oxide, elemental cobalt and cobalt alloys, elemental nickel and nickel alloys, elemental silver and silver alloys, elemental platinum and platinum alloys, elemental gold and gold alloys.

9. The method according to claim 1 wherein the thru-film sacrificial release holes exhibits a relatively high aspect ratio of at least 1 to 1.

10. The method according to claim 1 wherein said depositing the hole-sealing film is done by a physical vapor deposition process using a target plate inside a deposition chamber.

11. The method according to claim 10 wherein said physical vapor deposition process employs a sputtering deposition process.

12. The method according to claim 11 wherein the sputtering deposition process uses gaseous argon so that the cavity contains gaseous argon and the thru-film sacrificial release holes are sealed.

13. The method according to claim 10 wherein said physical vapor deposition process employs an evaporation deposition process.

14. The method according to claim 10 wherein the target plate forms a slant angle with the substrate in the deposition chamber.

15. The method according to claim 14, wherein the slant angle is from 0 degree to 30 degree.

16. The method according to claim 1 wherein said depositing the hole-sealing film is done by a chemical vapor deposition process inside a deposition chamber.

* * * * *